(12) United States Patent
Teraguchi et al.

(10) Patent No.: US 9,991,415 B2
(45) Date of Patent: Jun. 5, 2018

(54) DISPLAY DEVICE AND METHOD OF PRODUCING DISPLAY DEVICE

(71) Applicant: Sharp Kabushiki Kaisha, Sakai, Osaka (JP)

(72) Inventors: Nobuaki Teraguchi, Sakai (JP); Takuya Sato, Sakai (JP); Keiji Watanabe, Sakai (JP); Kohichiroh Adachi, Sakai (JP); Akihide Shibata, Sakai (JP); Hiroshi Iwata, Sakai (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days. days.

(21) Appl. No.: 15/527,047

(22) PCT Filed: Nov. 18, 2015

(86) PCT No.: PCT/JP2015/082364
§ 371 (c)(1),
(2) Date: May 16, 2017

(87) PCT Pub. No.: WO2016/084671
PCT Pub. Date: Jun. 2, 2016

(65) Prior Publication Data
US 2017/0338372 A1   Nov. 23, 2017

(30) Foreign Application Priority Data
Nov. 26, 2014   (JP) .................. 2014-239247

(51) Int. Cl.
*H01L 33/06*   (2010.01)
*H01L 33/24*   (2010.01)
(Continued)

(52) U.S. Cl.
CPC .......... *H01L 33/0075* (2013.01); *H01L 33/06* (2013.01); *H01L 33/08* (2013.01);
(Continued)

(58) Field of Classification Search
CPC ......... C30B 33/12; C30B 29/36; C30B 33/10; C01B 32/956; B24B 37/044; B08B 3/08;
(Continued)

(56) References Cited

U.S. PATENT DOCUMENTS

2013/0027623 A1   1/2013 Negishi et al.

FOREIGN PATENT DOCUMENTS

| JP | 2011-211047 A | 10/2011 |
|---|---|---|
| JP | 2012-019241 A | 1/2012 |
| JP | 2014-123583 A | 7/2014 |

OTHER PUBLICATIONS

Official Communication issued in International Patent Application No. PCT/JP2015/082364, dated Jan. 26, 2016.

*Primary Examiner* — Selim Ahmed
(74) *Attorney, Agent, or Firm* — Keating & Bennett, LLP

(57) ABSTRACT

A configuration of a display device capable of color display is obtained. The display device includes a plurality of rod-shaped light-emitting elements each of which includes a semiconductor and which emit light beams having wavelength distributions different from each other, and alignment electrodes (12). The alignment electrodes (12) include a first electrode pair (12a), a second electrode pair (12b), and a third electrode pair (12c). The plurality of rod-shaped light-emitting elements include a first rod-shaped light-emitting element, which is arranged so that one end of the first rod-shaped light-emitting element is adjacent to one electrode of the first electrode pair while the other end is adjacent to the other electrode of the first electrode pair, a second rod-shaped light-emitting element, which is arranged so that one end of the second rod-shaped light-emitting element is adjacent to one electrode of the second electrode pair while the other end of the second rod-shaped light-emitting element is adjacent to the other electrode of the second electrode pair, and a third rod-shaped light-emitting (Continued)

element, which is arranged so that one end of the third rod-shaped light-emitting element is adjacent to one electrode of the third electrode pair while the other end of the third rod-shaped light-emitting element is adjacent to the other electrode of the third electrode pair. Lengths $R_1$ to $R_3$ of the first to third rod-shaped light-emitting elements and distances $d_1$ to $d_3$ of the first to third electrode pairs (12$a$) to (12$c$) satisfy the following relationships. $d_1 \leq R_1 < d_2$, $d_2 \leq R_2 < d_3$, $d_3 \leq R_3$.

9 Claims, 9 Drawing Sheets

(51) Int. Cl.
    *H01L 33/00*     (2010.01)
    *H01L 33/08*     (2010.01)
    *H01L 33/32*     (2010.01)
    *H01L 33/38*     (2010.01)

(52) U.S. Cl.
    CPC .............. *H01L 33/24* (2013.01); *H01L 33/32* (2013.01); *H01L 33/387* (2013.01); *H01L 2933/0016* (2013.01)

(58) Field of Classification Search
    CPC ... C09K 3/1409; C09G 1/02; H01L 21/02052; H01L 21/30625; H01L 29/045; H01L 29/1608
    See application file for complete search history.

DISPLAY DEVICE AND METHOD OF PRODUCING DISPLAY DEVICE

TECHNICAL FIELD

The present invention relates to a display device and a method of producing the display device and relates more specifically to a display device using rod-shaped light-emitting elements and a method of producing the display device.

BACKGROUND ART

Japanese Unexamined Patent Application Publication No. 2014-123583A and Japanese Unexamined Patent Application Publication No. 2012-019241A disclose light-emitting devices each using rod-shaped light-emitting elements. Japanese Unexamined Patent Application Publication No. 2014-123583A describes shapes of single-wavelength rod-shaped light-emitting elements for aligning the rod-shaped light-emitting elements with high yields. Japanese Unexamined Patent Application Publication No. 2012-019241A describes a producing method for aligning rod-shaped light-emitting elements.

SUMMARY OF INVENTION

However, neither Japanese Unexamined Patent Application Publication No. 2014-123583A nor Japanese Unexamined Patent Application Publication No. 2012-019241A describes any method for providing a display device using rod-shaped light-emitting elements that provides color capability.

An object of the present invention is to obtain a configuration of a display device capable of color display. Another object of the present invention is to obtain a method of producing a display device capable of color display.

A display device disclosed herein includes a plurality of rod-shaped light-emitting elements each of which includes a semiconductor and that emit light beams having wavelength distributions different from each other, and alignment electrodes. The alignment electrodes include a first electrode pair, which is comprised of a pair of electrodes arranged with a distance $d_1$ from each other, a second electrode pair, which is comprised of a pair of electrodes arranged with a distance $d_2$ from each other, and a third electrode pair, which is comprised of a pair of electrodes arranged with a distance $d_3$ from each other. The plurality of rod-shaped light-emitting elements include a first rod-shaped light-emitting element, which has an axial length $R_1$ and is arranged so that one end of the first rod-shaped light-emitting element is adjacent to one of the electrodes of the first electrode pair while another end of the first rod-shaped light-emitting element is adjacent to the other of the electrodes of the first electrode pair, a second rod-shaped light-emitting element, which has an axial length $R_2$ and is arranged so that one end of the second rod-shaped light-emitting element is adjacent to one of the electrodes of the second electrode pair while another end of the second rod-shaped light-emitting element is adjacent to the other of the electrodes of the second electrode pair, and a third rod-shaped light-emitting element, which has an axial length $R_3$ and is arranged so that one end of the third rod-shaped light-emitting element is adjacent to one of the electrodes of the third electrode pair while another end of the third rod-shaped light-emitting element is adjacent to the other of the electrodes of the third electrode pair.

The lengths $R_1$ to $R_3$ and the distances $d_1$ to $d_3$ satisfy the following relationships (1) to (3).

$$d_1 \leq R_1 < d_2 \quad (1)$$

$$d_2 \leq R_2 < d_3 \quad (2)$$

$$d_3 \leq R_3 \quad (3)$$

A method of producing a display device disclosed herein includes: applying, to a substrate, a solvent in which first rod-shaped light-emitting elements each having an axial length $R_1$ are dispersed, to align the first rod-shaped light-emitting element; after aligning the first rod-shaped light-emitting element, applying, to the substrate, a solvent in which second rod-shaped light-emitting elements each having an axial length $R_2$ are dispersed, to align the second rod-shaped light-emitting element; and after aligning the second rod-shaped light-emitting element, applying, to the substrate, a solvent in which third rod-shaped light-emitting elements each having an axial length $R_3$ are dispersed, to align the third rod-shaped light-emitting element. Alignment electrodes are formed on the substrate, the alignment electrodes including a pair of electrodes arranged with a distance $d_1$ from each other, a pair of electrodes arranged with a distance $d_2$ from each other, and a pair of electrodes arranged with a distance $d_3$ from each other. The lengths $R_1$ to $R_3$ and the distances $d_1$ to $d_3$ satisfy the following relationships (11) to (13).

$$d_1 \leq R_1 < d_2 \quad (11)$$

$$d_2 \leq R_2 < d_3 \quad (12)$$

$$d_3 \leq R_3 \quad (13)$$

According to the present invention, it is possible to obtain a configuration of and a producing method for a display device capable of providing color display.

DESCRIPTION OF EMBODIMENTS

Figure 1:
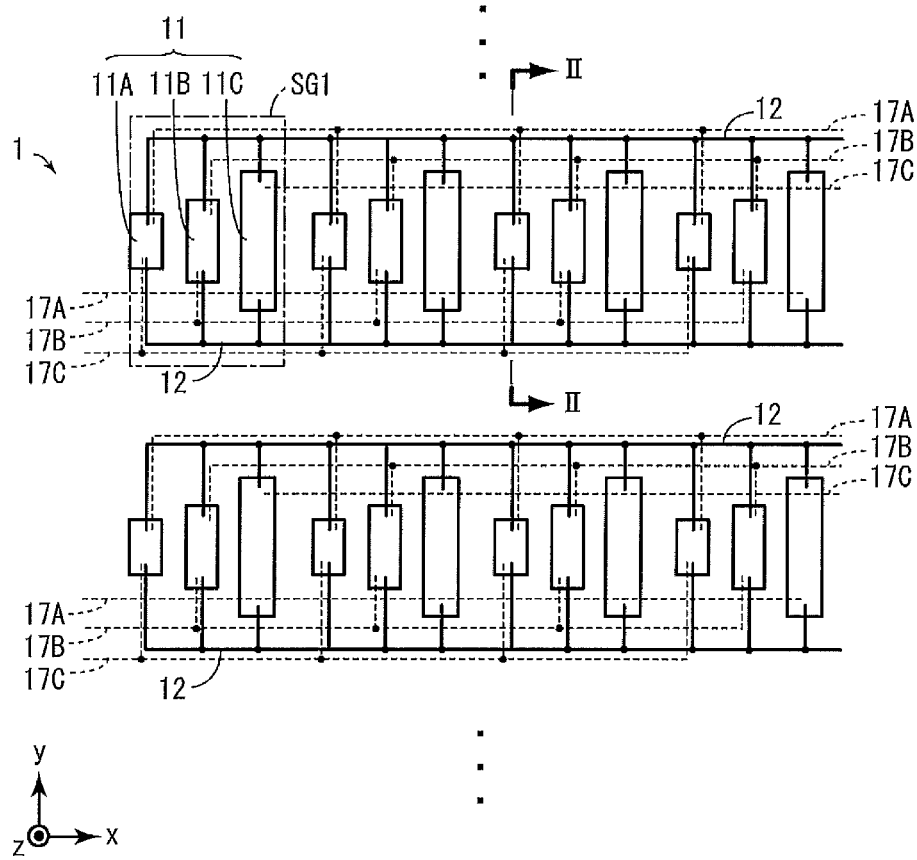
FIG. 1 is a plan view schematically illustrating a schematic configuration of a display device according to a first embodiment of the present invention.

A display device according to an embodiment of the present invention includes a plurality of rod-shaped light-emitting elements each of which includes a semiconductor and which emit light beams having different wavelength distributions from each other, and alignment electrodes. The alignment electrodes include a first electrode pair comprised of a pair of electrodes arranged with a distance $d_1$, a second electrode pair comprised of a pair of electrodes arranged with a distance $d_2$, and a third electrode pair comprised of a pair of electrodes arranged with a distance $d_3$. The plurality of rod-shaped light-emitting elements include a first rod-shaped light-emitting element, which has an axial length $R_1$ and which is arranged so that one end of the first rod-shaped light-emitting element is adjacent to one electrode of the first electrode pair and the other end is adjacent to the other electrode of the first electrode pair, a second rod-shaped light-emitting element, which has an axial length $R_2$ and which is arranged so that one end of the second rod-shaped light-emitting element is adjacent to one electrode of the second electrode pair and the other end is adjacent to the other electrode of the second electrode pair, and a third rod-shaped light-emitting element, which has an axial length $R_3$ and which is arranged so that one end of the third rod-shaped light-emitting element is adjacent to one electrode of the third electrode pair and the other end is adjacent to the other electrode of the third electrode pair. The lengths $R_1$ to $R_3$ and the distances $d_1$ to $d_3$ satisfy the following relationships (1) to (3) (first configuration).

$$d_1 \leq R_1 < d_2 \quad (1)$$

$$d_2 \leq R_2 < d_3 \quad (2)$$

$$d_3 \leq R_3 \quad (3)$$

According to the above configuration, the display device includes the plurality of rod-shaped light-emitting elements, which emit light beams having different wavelength distributions from each other. The display device is capable of displaying a color image by additive color mixture.

For the display of a color image, each of the plurality of rod-shaped light-emitting elements needs to be aligned at a prescribed position according to each of the wavelength distributions of the light beams emitted by each of the plurality of rod-shaped light-emitting elements. The display device includes alignment electrodes. With this configuration, it is possible to align the plurality of rod-shaped light-emitting elements along the alignment electrodes by electrostatic induction caused by applying voltage to the alignment electrode.

The plurality of rod-shaped light-emitting elements include the first to third rod-shaped light-emitting elements. The alignment electrodes includes the first to third electrode pairs. The axial lengths $R_1$ to $R_3$ of the first to third rod-shaped light-emitting elements and the distances $d_1$ to $d_3$ of the first to third electrode pairs satisfy the above relationships (1) to (3). With this configuration, by aligning the first rod-shaped light-emitting element, the second rod-shaped light-emitting element, and the third rod-shaped light-emitting element in this order, it is possible to align the first rod-shaped light-emitting element with the first electrode pair, the second rod-shaped light-emitting element with the second electrode pair, and the third rod-shaped light-emitting element with the third electrode pair.

Specifically, the axial length $R_1$ of the first rod-shaped light-emitting element is shorter than any of the distance $d_2$ between the electrodes of the second electrode pair and the distance $d_3$ between the electrodes of the third electrode pair, and hence the first rod-shaped light-emitting element aligns with neither the second electrode pair nor the third electrode pair. For this reason, the first rod-shaped light-emitting element is aligned with the first electrode pair. When the second rod-shaped light-emitting element is aligned after the first rod-shaped light-emitting element is aligned, the second rod-shaped light-emitting element aligns with the second electrode pair without aligning with the third electrode pair since the axial length $R_2$ of the second rod-shaped light-emitting element is shorter than the distance $d_3$ between the electrodes of the third electrode pair. When the third rod-shaped light-emitting element is aligned after the second rod-shaped light-emitting element is aligned, the third rod-shaped light-emitting element aligns with the third electrode pair.

As described above, with the above configuration, it is possible to arrange each of the plurality of rod-shaped light-emitting element at the prescribed position according to each of the wavelength distribution of each of the light beams to be emitted by the plurality of rod-shaped light-emitting elements.

In the above first configuration, the plurality of rod-shaped light-emitting elements are preferably configured so as to be greater in axial length and/or width in order of decreasing luminous sensitivity of light to emit (second configuration).

With the above configuration, it is possible to further equalize the brightnesses of the respective colors perceived by an observer.

In the above first or second configuration, when the widths of the first to third rod-shaped light-emitting elements are denoted respectively by $Rw_1$ to $Rw_3$ and the widths of the first to third electrode pairs are denoted respectively by $w_1$ to $w_3$, the widths $Rw_1$ to $Rw_3$ and the widths $w_1$ to $w_3$ preferably satisfy the following relationships (4) to (6) (third configuration).

$$Rw_1 \geq w_1 \tag{4}$$

$$Rw_2 \geq w_2 \tag{5}$$

$$Rw_3 \geq w_3 \tag{6}$$

According to the above configuration, it is possible to prevent, in the alignment of the rod-shaped light-emitting elements, two or more rod-shaped light-emitting elements from aligning with a single electrode pair.

When the widths of the first to third rod-shaped light-emitting elements are denoted respectively by $Rw_1$ to $Rw_3$, and the distance between the first electrode pair and the second electrode pair is denoted by $d_{intra1}$ and the distance between the second electrode pair and the third electrode pair is denoted by $d_{intra2}$, in any one of the above first to third configurations, the widths $Rw_1$ to $Rw_3$ and the distances $d_{intra1}$ and $d_{intra2}$ preferably satisfy the following relationships (7) and (8) (fourth configuration).

$$(Rw_1+Rw_2)/2 < d_{intra1} \tag{7}$$

$$(Rw_2+Rw_3)/2 < d_{intra2} \tag{8}$$

With the above configuration, it is possible to prevent adjacent rod-shaped light-emitting elements from coming into contact with each other.

It is preferable in any one of the above first to fourth configurations that a fourth electrode pair, which is comprised of a pair of electrodes arranged with a distance $d_4$ from each other, is further included, and the plurality of rod-shaped light-emitting elements include a fourth rod-shaped light-emitting element, which has an axial length $R_4$ and is arranged so that one end of the fourth rod-shaped light-emitting element is adjacent to one of the electrodes of the fourth electrode pair and the other end is adjacent to the other of the electrodes of the fourth electrode pair, and the lengths $R_3$ and $R_4$ and the distance $d_4$ satisfy the following relationships (9) and (10) (fifth configuration).

$$R_3 < d_4 \tag{9}$$

$$d_4 \leq R_4 \tag{10}$$

With the above configuration, it is possible to expand the color gamut of an image to be displayed by the display device.

A method of producing a display device according to an embodiment of the present invention includes applying, to a substrate, a solvent in which first rod-shaped light-emitting elements each having an axial length $R_1$ are distributed and aligning the first rod-shaped light-emitting element, after aligning the first rod-shaped light-emitting element, applying, to the substrate, s solvent in which second rod-shaped light-emitting elements each having an axial length $R_2$ are distributed and aligning the second rod-shaped light-emitting element, and after aligning the second rod-shaped light-emitting elements, applying, to the substrate, a solvent in which third rod-shaped light-emitting elements each having an axial length $R_3$ are distributed and aligning the third rod-shaped light-emitting element. On the substrate, alignment electrodes are formed, the alignment electrodes including a pair of electrodes arranged with a distance $d_1$ from each other, a pair of electrodes arranged with a distance $d_2$ from each other, and a pair of electrodes arranged with a distance $d_3$ from each other. The lengths $R_1$ to $R_3$ and the distances $d_1$ to $d_3$ satisfy the following relationships (11) to (13).

$$d_1 \leq R_1 < d_2 \tag{11}$$

$$d_2 \leq R_2 < d_3 \tag{12}$$

$$d_3 \leq R_3 \tag{13}$$

Embodiments

Embodiments of the present invention will be described below in detail with reference to the drawings. The same reference signs are assigned to the same or equivalent parts, and description thereof is not repeated. For simple explanation, a configuration is simplified or schematically illustrated, or some of components are omitted in the drawings to be referred to below. The scale ratios between components illustrated in the drawings do not necessarily indicate the actual scale ratios.

First Embodiment

Entire Configuration

Figure 2:
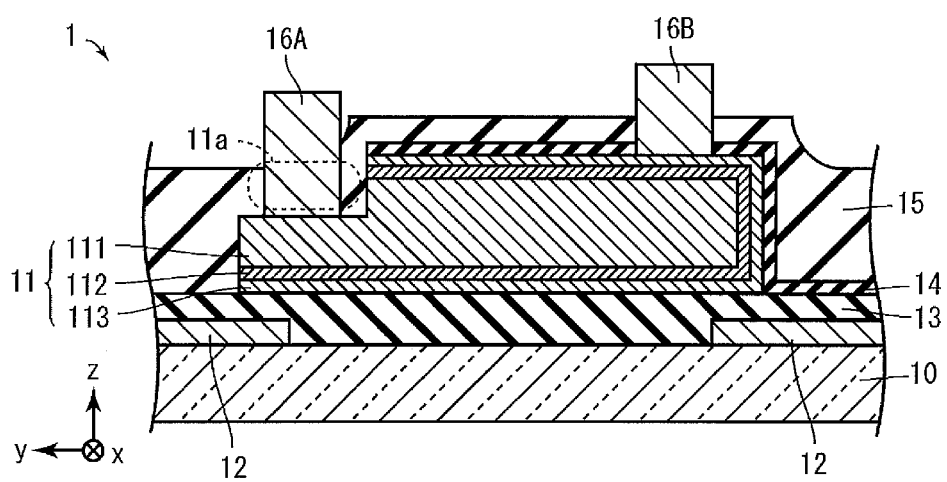
FIG. 2 is a cross-sectional view taken along a line II-II in FIG. 1.

FIG. 1 is a plan view schematically illustrating a schematic configuration of a display device 1 according to a first embodiment of the present invention. FIG. 2 is a cross-sectional view taken along a line II-II in FIG. 1. The display device 1 includes a substrate 10 (FIG. 2), a plurality of rod-shaped light-emitting elements 11, alignment electrodes 12, insulating films 13, 14, and 15 (FIG. 2), ohmic electrodes 16A and 16B (FIG. 2), and interconnections 17A, 17B, and 17C (FIG. 1). Note that, in FIG. 2, illustration of the interconnections 17A, 17B, and 17C is omitted.

The plurality of rod-shaped light-emitting elements 11 are arranged regularly on the substrate 10 (FIG. 2). The substrate 10 is, for example, a glass substrate. Each of the rod-shaped light-emitting elements 11 has a columnar shape extending in one direction and is arranged so that the axial direction of the rod-shaped light-emitting element 11 is parallel to the substrate 10. In other words, each of the rod-shaped light-emitting elements 11 is arranged so as to lie on its side on the substrate 10.

In the display device 1, the rod-shaped light-emitting elements 11 are arranged so that the axial directions of all the rod-shaped light-emitting elements 11 are parallel to each other. For the purpose of illustration, a direction parallel to the axial directions of the rod-shaped light-emitting elements 11 is referred to as a y direction, and a direction orthogonal to the y direction in the plane of the substrate 10 is referred to as an x direction, below. Moreover, a direction perpendicular to the substrate 10 is referred to as a z direction.

Each of the rod-shaped light-emitting elements 11 is a light-emitting element formed of a semiconductor. The rod-shaped light-emitting elements 11 include rod-shaped light-emitting elements 11A (first rod-shaped light-emitting elements), rod-shaped light-emitting elements 11B (second rod-shaped light-emitting elements), and rod-shaped light-emitting elements 11C (third rod-shaped light-emitting elements), which emit light beams having wavelength distributions different from each other. In the present embodiment, the rod-shaped light-emitting elements 11A emit red light, the rod-shaped light-emitting elements 11B emit green light, and the rod-shaped light-emitting elements 11C emit blue light.

The interconnections 17A, 17B, and 17C are electrically connected to the rod-shaped light-emitting elements 11A, 11B, and 11C, respectively. The interconnections 17A, 17B, and 17C are metal films made of, for example, aluminum. The interconnections 17A, 17B, and 17C are connected to the rod-shaped light-emitting elements 11A, 11B, and 11C via the ohmic electrodes 16A and 16B (FIG. 2). Although the configuration is not illustrated in detail, the interconnections 17A, 17B, and 17C are formed so as not to cause any short circuit between each other by using insulating films or the like. The rod-shaped light-emitting elements 11A, 11B, and 11C emit light beams on the basis of signals provided via the interconnections 17A, 17B, and 17C.

In the display device 1, three light-emitting elements, the rod-shaped light-emitting elements 11A, 11B, and 11C, form a single segment SG1. On the substrate 10 (FIG. 2), a plurality of segments SG1 are arranged regularly lengthwise and crosswise. The display device 1 displays a color image by additive color mixture by controlling each of the emission intensities of the rod-shaped light-emitting elements 11A, 11B, and 11C.

The alignment electrodes 12 are further formed on the substrate 10. Each of the alignment electrodes 12 is a metal film made of, for example, aluminum. The alignment electrodes 12 are arranged so as to overlap part of the rod-shaped light-emitting elements 11 in a planar view (when seen in the xy-plane). However, the insulating film 13 (FIG. 2) is formed between the rod-shaped light-emitting elements 11 and the alignment electrodes 12, and hence the rod-shaped light-emitting elements 11 and the alignment electrodes 12 are not electrically connected to each other. As will be described later, the alignment electrodes 12 are used to align the rod-shaped light-emitting elements 11.

The insulating film 14 (FIG. 2) is formed so as to cover part of the rod-shaped light-emitting elements 11 and the insulating film 13. The insulating film 14 fixes the rod-shaped light-emitting elements 11 onto the insulating film 13. Each of the insulating films 13 and 14 is, for example, a $SiO_2$ film.

The insulating film 15 (FIG. 2) is formed so as to cover part of the rod-shaped light-emitting elements 11, the insulating film 13, and the insulating film 14. The insulating film 15 insulates the rod-shaped light-emitting elements 11 and the interconnections 17A, 17B, and 17C (FIG. 1) from each other and also planarizes a surface of the substrate 10. The insulating film 15 is, for example, a spin on glass (SOG) film.

The ohmic electrodes 16A and 16B (FIG. 2) are formed so as to penetrate through the insulating films 14 and 15 and be in contact with the rod-shaped light-emitting elements 11. Each of the ohmic electrodes 16A and 16B is a laminated film made of, for example, aluminum and titanium.

Configuration of Rod-Shaped Light-Emitting Elements 11

Next, a detailed configuration of the rod-shaped light-emitting elements 11 will be described with reference to FIG. 2. Each of the rod-shaped light-emitting elements 11 has a three-layer structure comprised of an n-type semiconductor layer 111, a multiple quantum well (MQW) layer, 112, and a p-type semiconductor layer 113. The n-type semiconductor layer 111 is, for example, n-type GaN. The MQW layer 112 is, for example, InGaN-MQW. The p-type semiconductor layer 113 is, for example, p-type GaN.

The n-type semiconductor layer 111 has a columnar shape. A peripheral surface and one end surface (the y-direction minus-side end surface in FIG. 2) of the n-type semiconductor layer 111 is covered by the MQW layer 112. A peripheral surface and one end surface (the y-direction minus-side end surface in FIG. 2) of the MQW layer 112 is covered by the p-type semiconductor layer 113. The other end surface (the y-direction plus-side end surface in FIG. 2) of the n-type semiconductor layer 111 is covered by neither the MQW layer 112 nor the p-type semiconductor layer 113. Moreover, the other end surface (the y-direction plus-side end surface in FIG. 2) of the MQW layer 112 is not covered by the p-type semiconductor layer 113.

A cut-out portion 11a is formed in a portion of the peripheral surface of the rod-shaped light-emitting element 11. At the cut-out portion 11a, the p-type semiconductor layer 113 and the MQW 112 are removed, and the n-type semiconductor layer 111 is exposed.

The ohmic electrode 16A is formed so as to be in contact with the n-type semiconductor layer 111 at the cut-out portion 11a. The ohmic electrode 16B is formed so as to be in contact with the p-type semiconductor layer 113 at a portion of the peripheral surface of the rod-shaped light-emitting element 11, the portion being other than the cut-out portion 11a.

When forward bias is applied to the rod-shaped light-emitting element 11 via the ohmic electrodes 16A and 16B, carrier recombination occurs in the MQW 112 formed between the n-type semiconductor layer 111 and the p-type semiconductor layer 113, which causes emission of light having a wavelength corresponding to the recombination energy. The MQW layer 112 increases the light-emitting efficiency of the rod-shaped light-emitting element 11 by quantum confinement effect.

The wavelength distribution of light emitted by each of the rod-shaped light-emitting elements 11 can be adjusted by the composition of semiconductor. For example, (Al)InGaP-based semiconductor can be used for red, InGaN-based semiconductor with a high In composition can be used for green, and InGaN-based semiconductor with a low In composition can be used for blue.

Configuration of Alignment Electrodes 12

Figure 3:
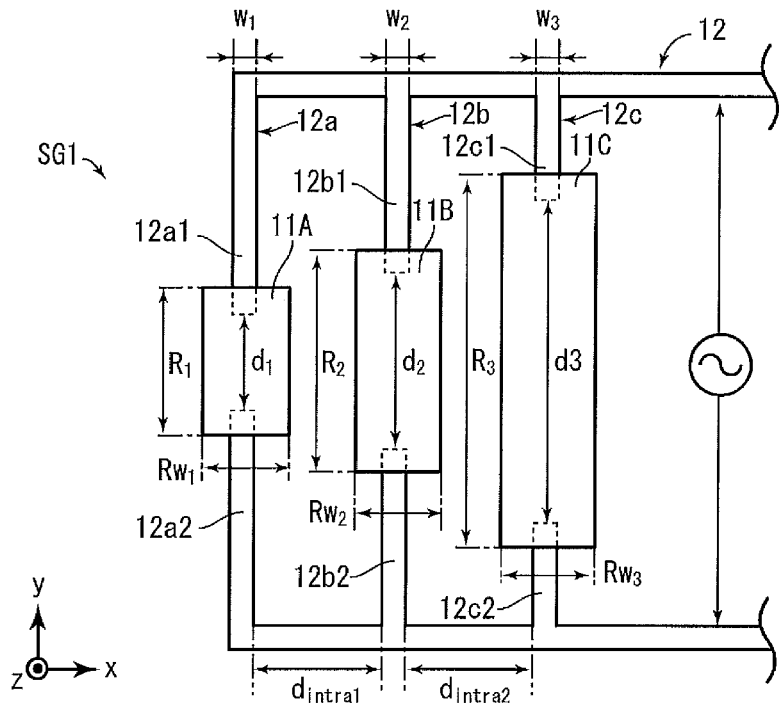
FIG. 3 is an enlarged plan view illustrating one of segments.

Next, a detailed configuration of the alignment electrodes 12 will be described with reference to FIG. 3. FIG. 3 is an enlarged plan view illustrating one of segments SG1. The alignment electrodes 12 include an electrode pair 12a (first electrode pair) comprised of electrodes 12a1 and 12a2, an electrode pair 12b (second electrode pair) comprised of electrodes 12b1 and 12b2, and an electrode pair 12c (third electrode pair) comprised of electrodes 12c1 and 12c2.

The electrode 12a1 and the electrode 12a2 are arranged with a distance $d_1$ from each other. The electrode 12b1 and the electrode 12b2 are arranged with a distance $d_2$ from each other. The electrode 12c1 and the electrode 12c2 are arranged with a distance $d_3$ from each other.

As illustrated in FIG. 3, the rod-shaped light-emitting element 11A is arranged so that one end of the rod-shaped light-emitting element 11A is adjacent to the electrode 12a1 and the other end is adjacent to the electrode 12a2. The rod-shaped light-emitting element 11B is arranged so that one end of the rod-shaped light-emitting element 11B is adjacent to the electrode 12b1 and the other end is adjacent to the electrode 12b2. The rod-shaped light-emitting element 11C is arranged so that one end of the rod-shaped light-emitting element 11C is adjacent to the electrode 12c1 and the other end is adjacent to the electrode 12c2.

When the axial lengths of the rod-shaped light-emitting elements 11A to 11C are denoted respectively by $R_1$ to $R_3$, the lengths $R_1$ to $R_3$ and the distances $d_1$ to $d_3$ satisfy the following relationships (1) to (3).

$$d_1 \leq R_1 < d_2 \qquad (1)$$

$$d_2 \leq R_2 < d_3 \quad (2)$$

$$d_3 \leq R_3 \quad (3)$$

Moreover, when the widths of the rod-shaped light-emitting elements 11A to 11C are denoted respectively by $Rw_1$ to $Rw_3$ and the widths of the electrode pairs 12a to 12c are denoted respectively by $w_1$ to $w_3$, the widths $Rw_1$ to $Rw_3$ and the widths $w_1$ to $w_3$ satisfy the following relationships (4) to (6).

$$Rw_1 \geq w_1 \quad (4)$$

$$Rw_2 \geq w_2 \quad (5)$$

$$Rw_3 \geq w_3 \quad (6)$$

Moreover, when the distance between the electrode pair 12a and the electrode pair 12b is denoted by $d_{intra1}$ and the distance between the electrode pair 12b and the electrode pair 12c is denoted by $d_{intra2}$, the widths $Rw_1$ to $Rw_3$ and the distances $d_{intra1}$ and $d_{intra2}$ satisfy the following relationships (7) and (8).

$$(Rw_1+Rw_2)/2 < d_{intra1} \quad (7)$$

$$(Rw_2+Rw_3)/2 < d_{intra2} \quad (8)$$

The lengths $R_1$ to $R_3$, the distances $d_1$ to $d_3$, the widths $Rw_1$ to $Rw_3$, the widths $w_1$ to $w_3$, and the distances $d_{intra1}$ and $d_{intra2}$ can be set, for example, as follows.

$$R_1 = 6 \text{ μm}, d_1 = 5 \text{ μm}$$

$$R_2 = 11 \text{ μm}, d_2 = 10 \text{ μm}$$

$$R_3 = 18 \text{ μm}, d_3 = 15 \text{ μm}$$

$$Rw_1 = Rw_2 = Rw_3 = 5 \text{ μm}$$

$$w_1 = w_2 = w_3 = 2 \text{ μm}$$

$$d_{intra1} = d_{intra2} = 8 \text{ μm}$$

In the display device 1, the electrode 12a1, the electrode 12b1, and the electrode 12c1 are electrically connected to each other, and the same signal is transmitted to the electrodes. Similarly, the electrode 12a2, the electrode 12b2, and the electrode 12c2 are electrically connected to each other, and the same signal is transmitted to the electrodes. As will be described later, a prescribed alternating voltage is applied between the electrode 12a1, the electrode 12b1, and the electrode 12c1 and the electrode 12a2, the electrode 12b2, and the electrode 12c2 from an external unit in a producing process for the display device 1.

Method of Producing Display Device 1

Figure 4:
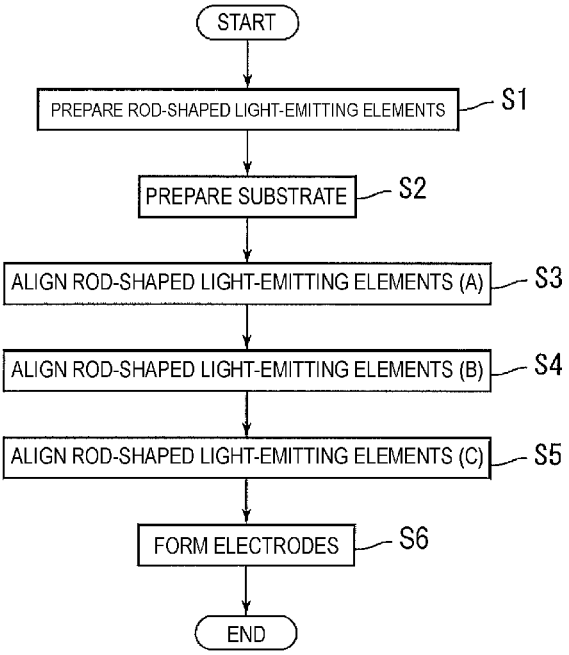
FIG. 4 is a flowchart illustrating an example of a method of producing a display device.

FIG. 4 is a flowchart illustrating an example of a method of producing the display device 1. This producing method includes preparing the rod-shaped light-emitting elements 11 (Step S1), preparing the substrate 10 on which the alignment electrodes 12 are formed (Step S2), aligning the rod-shaped light-emitting elements 11A (Step S3), aligning the rod-shaped light-emitting elements 11B (Step S4), aligning the rod-shaped light-emitting elements 11C (Step S5), and forming electrodes on the rod-shaped light-emitting elements 11 (Step S6).

Note that either the preparing of the rod-shaped light-emitting elements 11 (Step S1) and the preparing of the substrate 10 (Step S2) may be performed first. Alternatively, both of the preparings may be performed in parallel.

In the preparing of the rod-shaped light-emitting elements 11 (Step 1), the rod-shaped light-emitting elements 11A, 11B, and 11C are prepared individually. An example of a method of producing the rod-shaped light-emitting elements 11 will be described below with reference to FIG. 5A to FIG. 5H. The method of producing the rod-shaped light-emitting elements 11 is not limited to this.

Figure 5A:
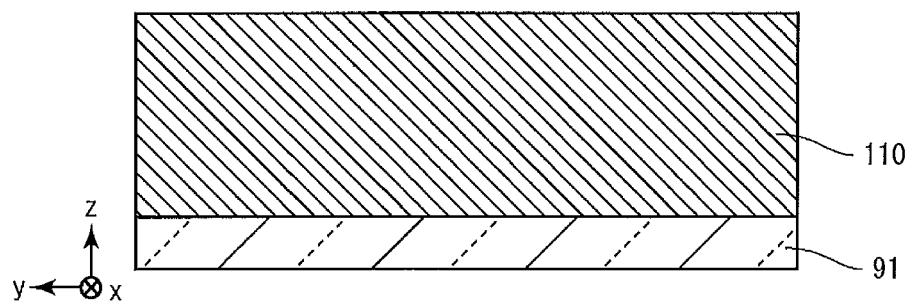
FIG. 5A is a cross-sectional view for describing an example of a method of producing rod-shaped light-emitting elements.

As illustrated in FIG. 5A, an n-type semiconductor layer 110 is grown to a prescribed thickness on a sapphire substrate 91 by a Hydride vapor phase epitaxy (HYPE) method. As a method of growing the n-type semiconductor layer 110, any method such as a metal organic chemical vapor deposition (MOCVD) method in addition to the HYPE method can be employed.

Figure 5B:
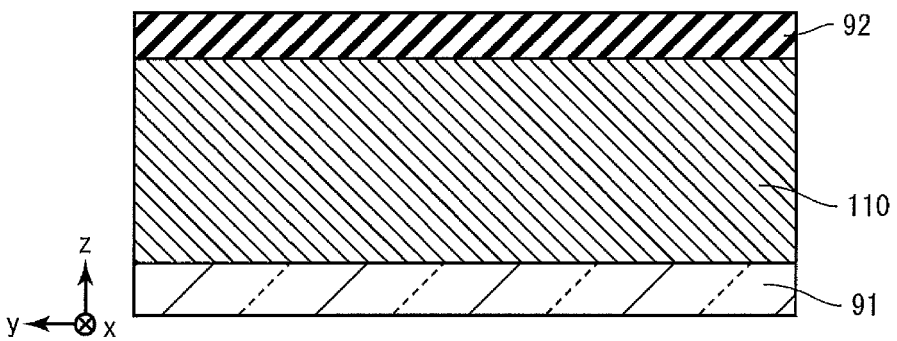
FIG. 5B is a cross-sectional view for describing an example of the method of producing the rod-shaped light-emitting elements.

As illustrated in FIG. 5B, a $SiO_2$ film 92 is deposited by a CVD method. The thickness of the $SiO_2$ film 92 is not limited as long as the $SiO_2$ film 92 remains as an etching mask for etching (described later). The thickness of the $SiO_2$ film 92 is, for example, 5 μm.

Figure 5C:
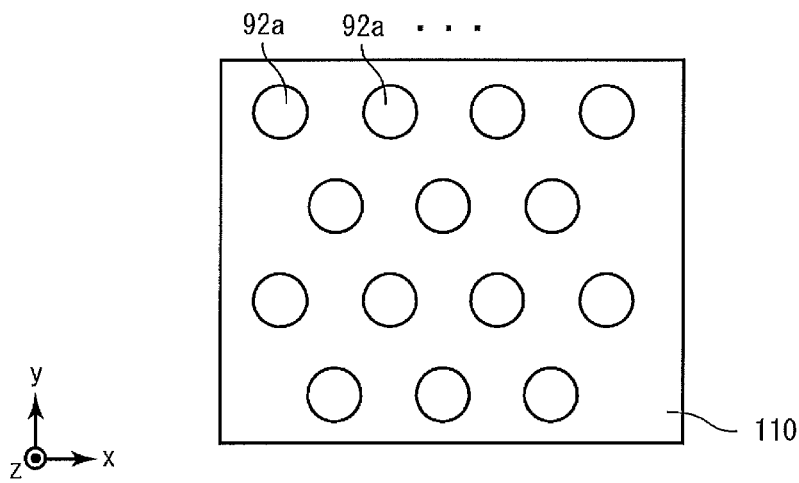
FIG. 5C is a plan view for describing an example of the method of producing the rod-shaped light-emitting elements.
Figure 5D:
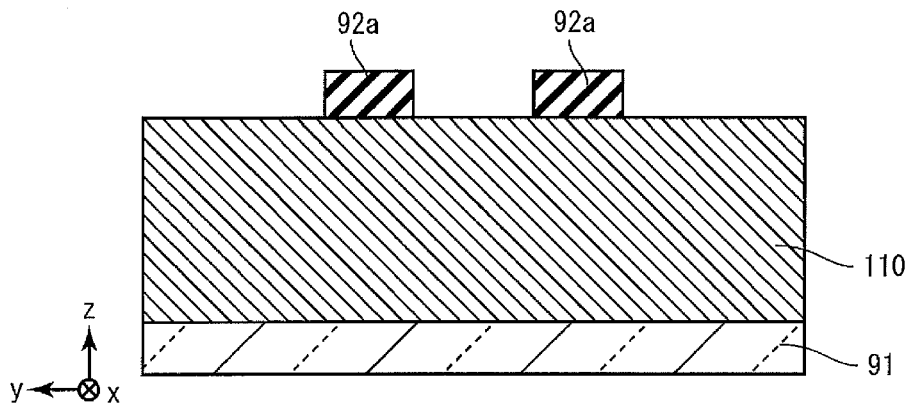
FIG. 5D is a cross-sectional view for describing an example of the method of producing the rod-shaped light-emitting elements.

As illustrated in FIG. 5C and FIG. 5D, the $SiO_2$ film 92 is patterned in a hexagonal grid pattern, to thereby form a $SiO_2$ film 92a. FIG. 5C is a plan view seen from a direction perpendicular to the sapphire substrate 91, and FIG. 5D is a cross-sectional view taken along an in-plane direction of the sapphire substrate 91.

Figure 5E:
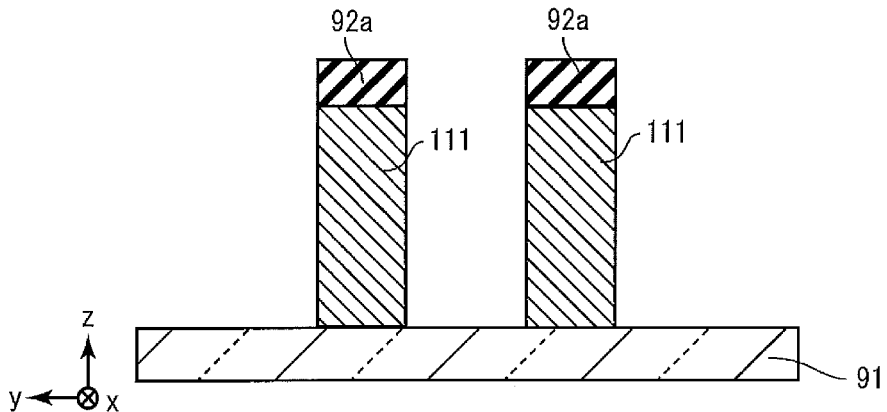
FIG. 5E is a cross-sectional view for describing an example of the method of producing the rod-shaped light-emitting elements.

As illustrated in FIG. 5E, the n-type semiconductor layer 110 is etched to the sapphire substrate 91 by using the $SiO_2$ film 92a as an etching mask, to thereby form the n-type semiconductor layer 111. After the completion of the etching, the $SiO_2$ film 92a is removed by using a hydrofluoric-acid-based etchant.

Figure 5F:
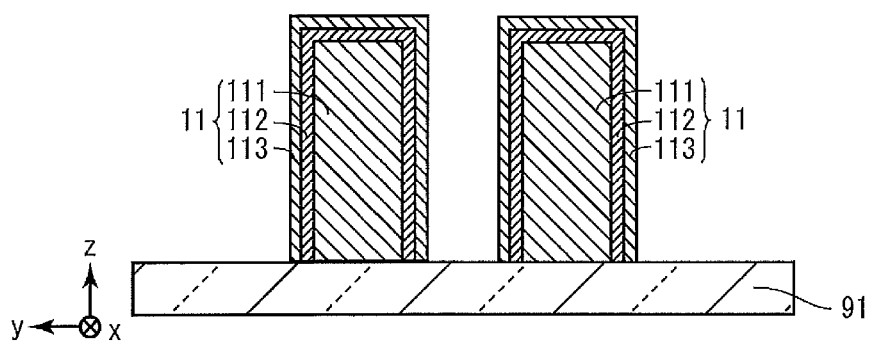
FIG. 5F is a cross-sectional view for describing an example of the method of producing the rod-shaped light-emitting elements.

As illustrated in FIG. 5F, an MQW layer 112 and a p-type semiconductor layer 113 are formed, for example, by the MOCVD or the like, to thereby form the rod-shaped light-emitting elements 11.

Figure 5G:
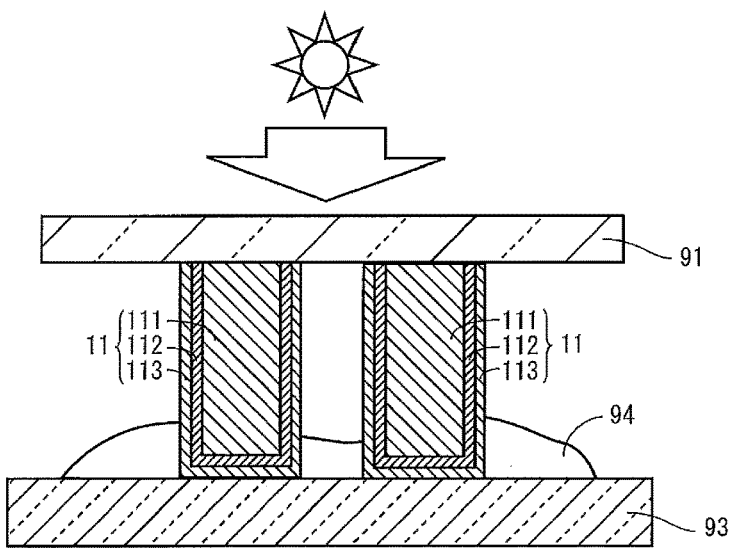
FIG. 5G is a cross-sectional view for describing an example of the method of producing the rod-shaped light-emitting elements.

As illustrated in FIG. 5G, one end of each of the the rod-shaped light-emitting elements 11 is fixed to a glass substrate 93 with wax 94 or the like. Then, in a state where a back surface of the sapphire substrate 91 faces upward, the back surface of the sapphire substrate 91 is irradiated with ArF excimer laser, to lift off the rod-shaped light-emitting elements 11 from the sapphire substrate 91.

Figure 5H:
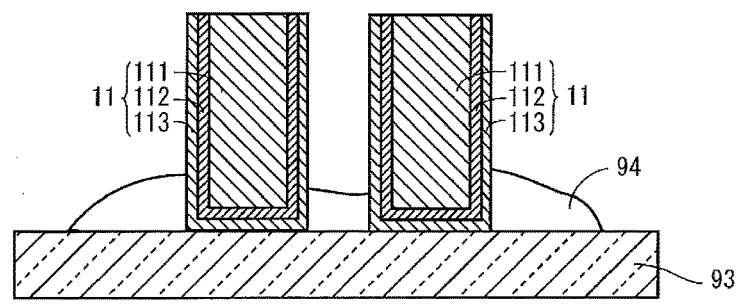
FIG. 5H is a cross-sectional view for describing an example of the method of producing the rod-shaped light-emitting elements.

As illustrated in FIG. 5H, the rod-shaped light-emitting elements 11 are fixed to the glass substrate 93 with the wax 94. By removing the wax 94, the plurality of rod-shaped light-emitting elements 11 are obtained.

Next, the substrate 10 on which the alignment electrodes 12 are formed is prepared (Step S2). The alignment electrodes 12 can be formed, for example, by depositing a metal film, such as aluminum, by spattering or vapor deposition, and patterning the metal film by photolithography. The insulating film 13 in FIG. 2 can be formed, for example, by depositing a $SiO_2$ film by a CVD method.

Next, the rod-shaped light-emitting elements 11A, 11B, and 11C are aligned in this order (Steps S3 to S5). In other words, the rod-shaped light-emitting elements are aligned in order of increasing axial length. The aligning of the rod-shaped light-emitting elements 11A will be described below with reference to FIG. 6 and FIG. 7. Although description is given of the rod-shaped light-emitting elements 11A here, the same applies to the rod-shaped light-emitting elements 11B and 11C.

The rod-shaped light-emitting elements 11A are dispersed in a solvent. The solvent is, for example, isopropyl alcohol (IPA). Instead of IPA, water, ethylene glycol, propylene glycol, methanol, ethanol, acetone, or the like may be used as the solvent.

Figure 6:
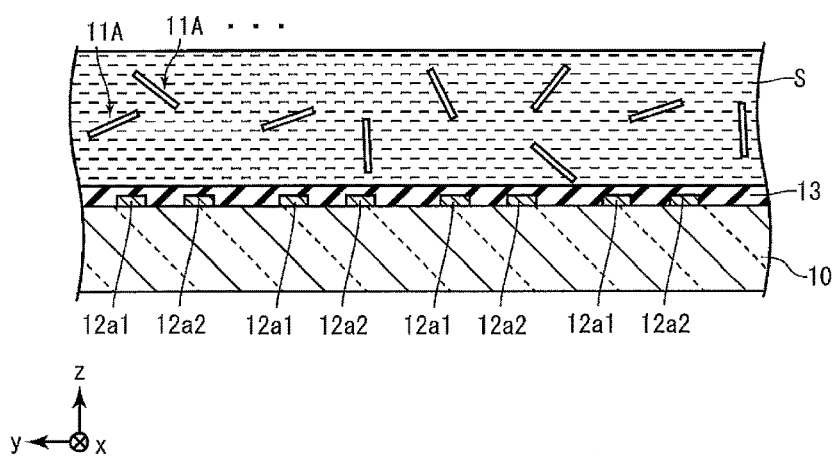
FIG. 6 is a schematic diagram for describing alignment of the rod-shaped light-emitting elements.

As illustrated in FIG. 6, a solvent S, in which the rod-shaped light-emitting elements 11A are dispersed, is applied to the substrate 10. The thickness of the solvent S to be applied may be any as long as the rod-shaped light-emitting elements 11A can move in the solvent S. Note that, however, it takes longer time to dry the solvent S if the thickness of the solvent S is too thick. The thickness of the solvent S is, for example, from several μm to several mm. The density of the rod-shaped light-emitting elements 11A in the solvent S is preferably $1*10^4$ to $1*10^7$ elements per $Cm^3$.

When applying the solvent S, an alternating voltage of approximately 1 to 2 V (approximately 10 to 100 kHz) is applied between the electrode 12a1 and the electrode 12a2, between the electrode 12b1 and the electrode 12b2, and between the electrode 12c1 and the electrode 12c2.

Figure 7:
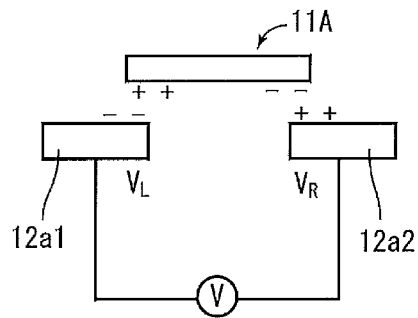
FIG. 7 is a schematic diagram illustrating a principle of the rod-shaped light-emitting elements aligned with electrodes.

FIG. 7 is a schematic diagram illustrating a principle of the rod-shaped light-emitting element 11A aligned with the electrodes 12a1 and 12a2. As illustrated in FIG. 7, when a potential $V_L$ is applied to the electrode 12a1 and a potential $V_R$ is applied to the electrode 12a2 ($V_L<V_R$), negative charges are induced at the electrode 12a1, and positive charges are induced at the electrode 12a2. When the rod-shaped light-emitting element 11A comes close to the electrodes 12a1 and 12a2, positive charges are induced on a side closer to the electrode 12a1 of the rod-shaped light-emitting element 11A, and negative charges are induced on a side closer to the electrode 12a2 of the rod-shaped light-emitting element 11A by electrostatic induction. Consequently, attractive force by electrostatic force is exerted between the rod-shaped light-emitting element 11A and the electrodes 12a1 and 12a2, and thereby the rod-shaped light-emitting element 11A aligns along an electric line of force occurring between the electrodes 12a1 and 12a2.

Figure 8A:
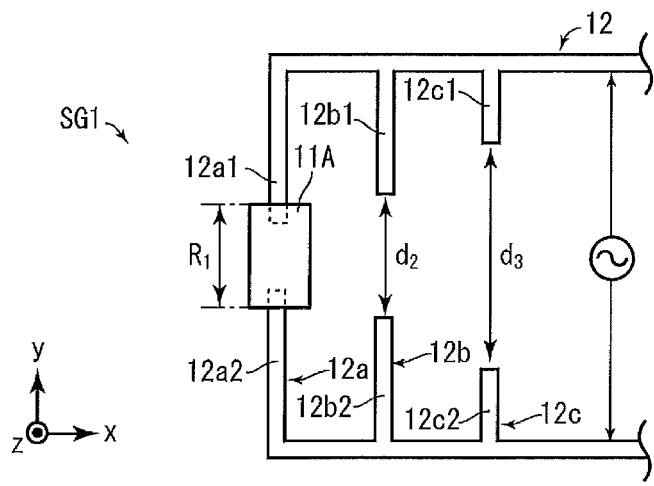
FIG. 8A is a plan view of the display device during production.
Figure 8B:
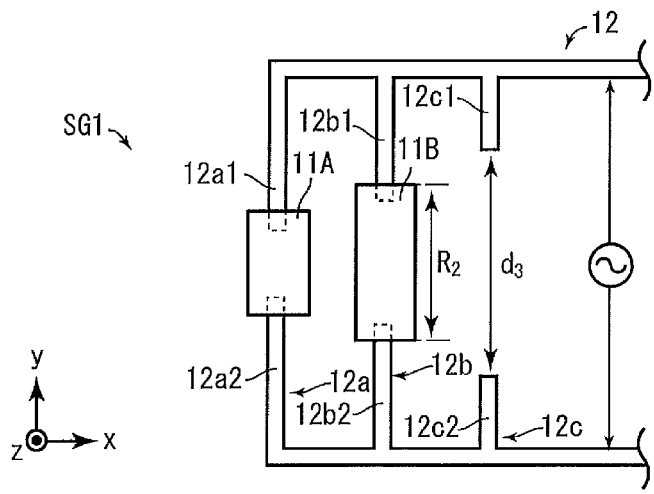
FIG. 8B is a plan view of the display device during production.
Figure 8C:
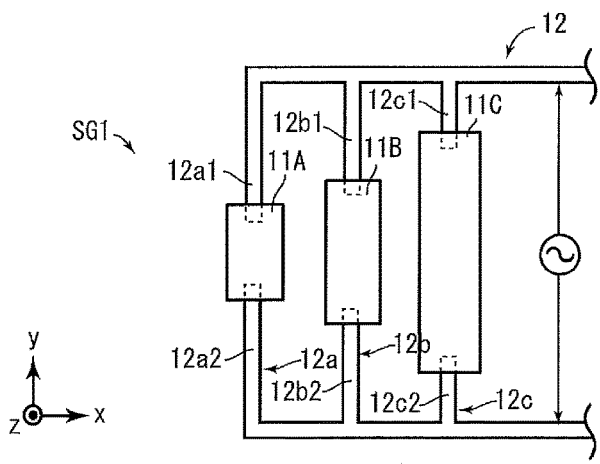
FIG. 8C is a plan view of the display device during production.

FIGS. 8A to 8C are plan views of the display device 1 during production. Since the axial length $R_1$ of each of the rod-shaped light-emitting elements 11A is shorter than any of $d_2$ and $d_3$, the rod-shaped light-emitting element 11A aligns with neither the electrode pairs 12b nor 12c. Hence, in Step S3, as illustrated in FIG. 8A, the rod-shaped light-emitting elements 11A align with the electrode pairs 12a. After aligning the rod-shaped light-emitting elements 11A, the solvent S is vapored, for example, by heating the substrate 10.

Thereafter, while the voltages are being applied to the electrodes, a solvent in which the rod-shaped light-emitting elements 11B are dispersed is applied to the substrate 10, to thereby align the rod-shaped light-emitting elements 11B in the same manner as above (Step S4).

Since the axial length $R_2$ of each of the rod-shaped light-emitting elements 11B is shorter than $d_3$, the rod-shaped light-emitting element 11B does not align with the electrode pair 12c. Hence, in Step S4, as illustrated in FIG. 8B, the rod-shaped light-emitting elements 11B align with the electrode pairs 12b. After aligning the rod-shaped light-emitting elements 11B, the solvent in which the rod-shaped light-emitting elements 11B are dispersed is vapored, for example, by heating the substrate 10.

Thereafter, while the voltages are being applied to the electrodes, a solvent in which the rod-shaped light-emitting elements 11C are dispersed is applied to the substrate 10, to thereby align the rod-shaped light-emitting elements 11C in the same manner as above (Step S5).

In Step S5, as illustrated in FIG. 8C, the rod-shaped light-emitting element 11C is aligned with the electrode pair 12c. After aligning the rod-shaped light-emitting elements 11C, the solvent in which the rod-shaped light-emitting elements 11C are dispersed is vapored, for example, by heating the substrate 10.

As described above, by aligning the rod-shaped light-emitting elements 11A, 11B, and 11C in this order, it is possible to align the rod-shaped light-emitting elements 11A with the electrode pairs 11a, the rod-shaped light-emitting elements 11B with the electrode pairs 11b, and the rod-shaped light-emitting elements 11C with the electrode pairs 11c.

Next, drive electrodes are formed on the rod-shaped light-emitting elements 11 (Step S6). Description will be given below of examples of after fixing the rod-shaped light-emitting elements 11 to the substrate 10 until forming the ohmic electrodes 16A and 16B on the rod-shaped light-emitting elements 11, with reference to FIG. 9A to FIG. 9D. The method of producing the display device 1 is not limited to this.

Figure 9A:
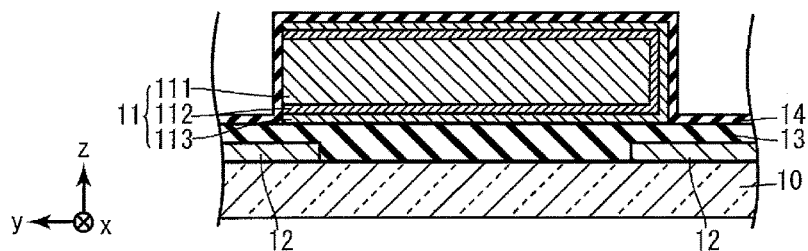
FIG. 9A is a schematic diagram describing an example of forming ohmic electrodes on the rod-shaped light-emitting element.

As illustrated in FIG. 9A, the insulating film 14 is formed, for example, by plasma CVD using tetraethyl orthosilicate (TEOS). The thickness of the insulating film 14 is, for example, 500 nm. The condition for plasma CVD is, for example, with a pressure of 120 Pa, a TEOS flow rate of 5 sccm, an $O_2$ flow rate of 195 sccm, and an RF power of 80 W, for 12 minutes.

Figure 9B:
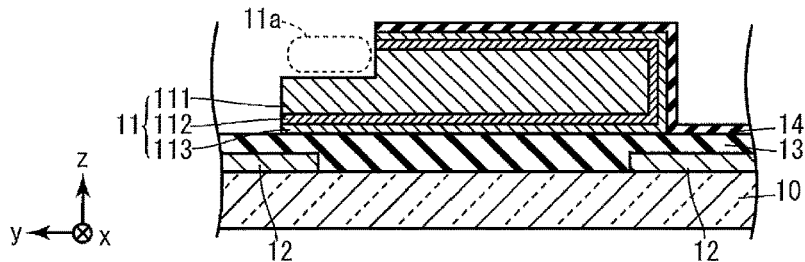
FIG. 9B is a schematic diagram describing an example of forming the ohmic electrodes on the rod-shaped light-emitting element.

As illustrated in FIG. 9B, part of each of the rod-shaped light-emitting elements 11 is etched, to form the cut-out portion 11a.

Figure 9C:
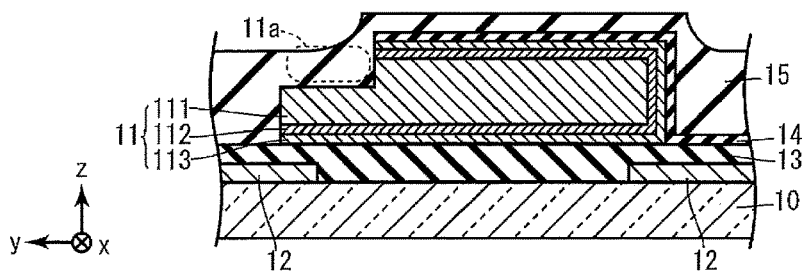
FIG. 9C is a schematic diagram describing an example of forming the ohmic electrodes on the rod-shaped light-emitting element.

As illustrated in FIG. 9C, for example, SOG is applied, to form the insulating film 15.

Figure 9D:
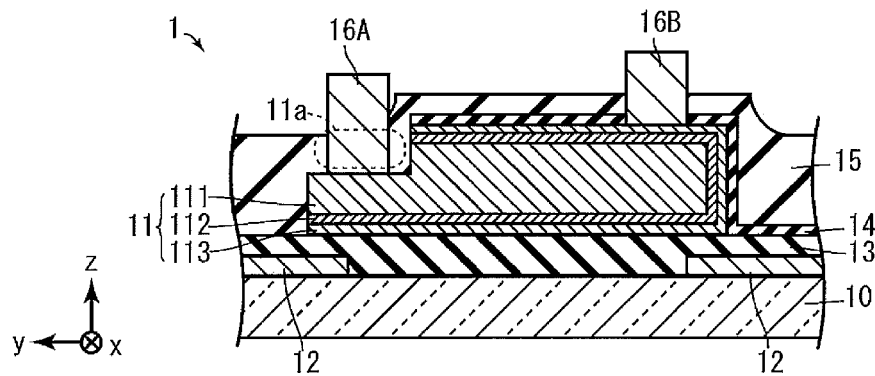
FIG. 9D is a schematic diagram describing an example of forming the ohmic electrodes on the rod-shaped light-emitting element.

As illustrated in FIG. 9D, the portions of the insulating films 14 and 15 in which the electrodes are to be formed are removed by etching, to further form the electrodes 16A and 16B.

After the drive electrodes are formed on the rod-shaped light-emitting elements 11, interconnections for transmitting signals, switching elements, and the like are formed. Since the configuration and method of producing the interconnections, switching elements, and the like are the same as those for the configuration and production method of an existing active matrix substrate, description thereof is omitted.

Effects of Display Device 1

The configuration and production method of the display device 1 according to the first embodiment of the present invention have been described above. According to the display device 1, by aligning the rod-shaped light-emitting elements 11A, 11B, and 11C in this order, it is possible to align the rod-shaped light-emitting elements 11A with the electrode pairs 11a, the rod-shaped light-emitting elements 11B with the electrode pairs 11b, and the rod-shaped light-emitting elements 11C with the electrode pairs 11c. By regularly aligning the rod-shaped light-emitting elements 11A, 11B, and 11C, which respectively emit red, green, blue light beams, a color image can be displayed by additive color mixture.

In addition, in the present embodiment, the widths $Rw_1$ to $Rw_3$ and the widths $w_1$ to $w_3$ satisfy the above relationships (4) to (6). With this configuration, it is possible to prevent two or more rod-shaped light-emitting elements 11 from aligning with a single electrode pair in the alignment of rod-shaped light-emitting elements 11.

In addition, in the present embodiment, the widths $Rw_1$ to $Rw_3$ and the distances $d_{intra1}$ and $d_{intra2}$ satisfy the above relationships (7) and (8). With this configuration, it is possible to prevent the adjacent rod-shaped light-emitting elements 11 from coming into contact with each other.

Second Embodiment

A display device according to a second embodiment of the present invention is different from the display device 1 in terms of the colors of light beams emitted by the respective rod-shaped light-emitting elements 11A to 11C. In the display device 1, the rod-shaped light-emitting elements 11A, 11B, and 11C respectively emit red, green, and blue light beams. In contrast to this, in the present embodiment, the rod-shaped light-emitting elements 11A, 11B, and 11C respectively emit green, red, and blue light beams. In other words, in the present embodiment, the rod-shaped light-emitting elements that emit green light beams are the shortest.

Human luminous sensitivity is at its peak around 555 nm, and green is perceived as being more luminous than other colors having the same luminosity. For this reason, when the widths of the rods are the same, the luminosity of each of the colors perceived by an observer can be made further equalized by using short light-emitting elements for green.

Third Embodiment

In a third embodiment, as in the second embodiment, the rod-shaped light-emitting elements 11A, 11B, and 11C respectively emit green, red, and blue light beams. The third embodiment is different from the second embodiment in terms of the widths of the rod-shaped light-emitting elements 11A to 11C. Specifically, in the first and second embodiments, the widths $Rw_1$ to $Rw_3$ of the rod-shaped light-emitting elements 11A to 11C have the following relationship: $Rw_1=Rw_2=Rw_3=5$ μm. In contrast to this, in the present embodiment, the following relationship is used: $Rw_1=Rw_2=5$ μm, and $Rw_3=8$ μm.

Changing the thickness of the rods enables control of emission intensities. This increases parameters for adjusting the entire color.

Fourth Embodiment

Figure 10:
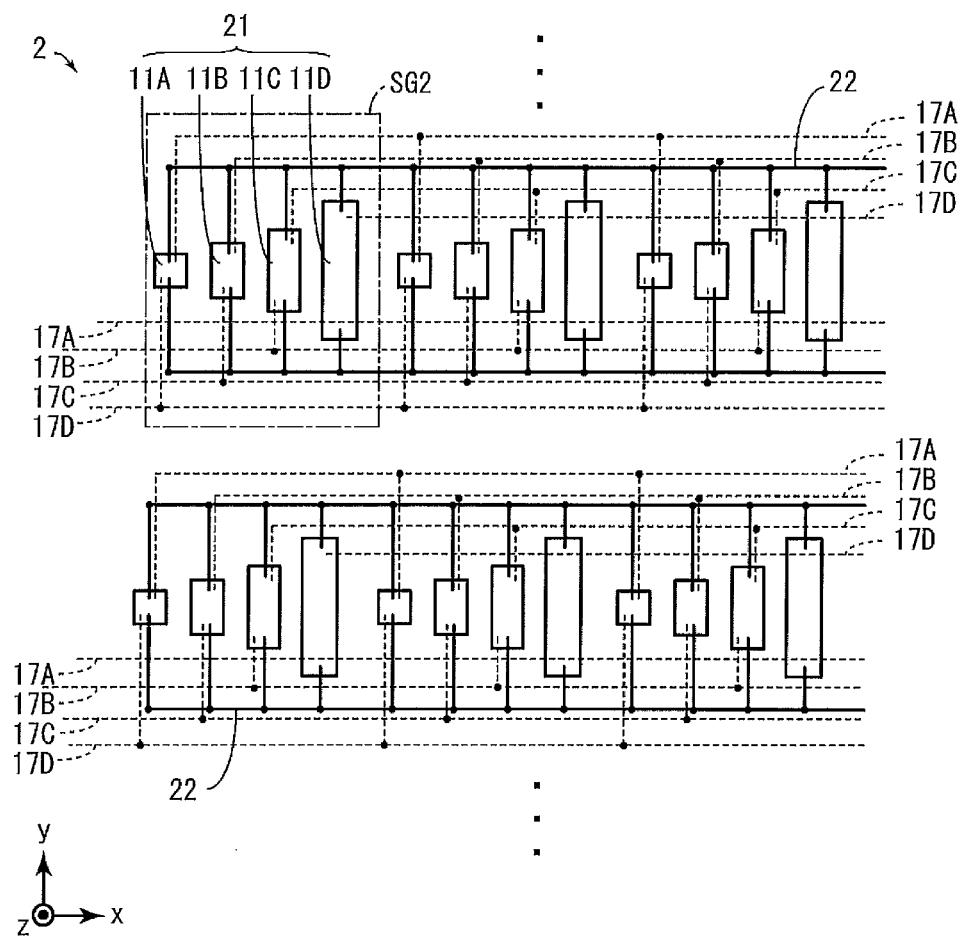
FIG. 10 is a plan view schematically illustrating a schematic configuration of a display device according to a fourth embodiment of the present invention.

FIG. 10 is a plan view schematically illustrating a schematic configuration of a display device 2 according to a fourth embodiment of the present invention. The display device 2 includes rod-shaped light-emitting elements 21 instead of the rod-shaped light-emitting elements 11, and alignment electrodes 22 instead of the alignment electrodes 12.

The plurality of rod-shaped light-emitting elements 21 further include, in addition to the rod-shaped light-emitting elements 11A to 11C, rod-shaped light-emitting elements 11D (fourth rod-shaped light-emitting elements) each having an axial length $R_4$. In the present embodiment, the rod-shaped light-emitting elements 11A emit red light beams, the rod-shaped light-emitting elements 11B emit yellow light beams, the rod-shaped light-emitting elements 11C emit green light beams, and the rod-shaped light-emitting elements 11D emit blue light beams.

Interconnections 17A, 17B, 17C, and 17D are electrically connected to the rod-shaped light-emitting elements 11A, 11B, 11C, and 11D, respectively. The rod-shaped light-emitting elements 11A, 11B, 11C, and 11D emit light beams on the basis of signals provided via the interconnections 17A, 17B, 17C, and 17D.

In the display device 2, four light-emitting elements, the rod-shaped light-emitting elements 11A, 11B, 11C, and 11D, form a single segment SG2. On a substrate, a plurality of segments SG2 are arranged regularly lengthwise and crosswise. The display device 2 displays a color image by additive color mixture by controlling the emission intensities of each of the rod-shaped light-emitting elements 11A, 11B, 11C, and 11D.

Figure 11:
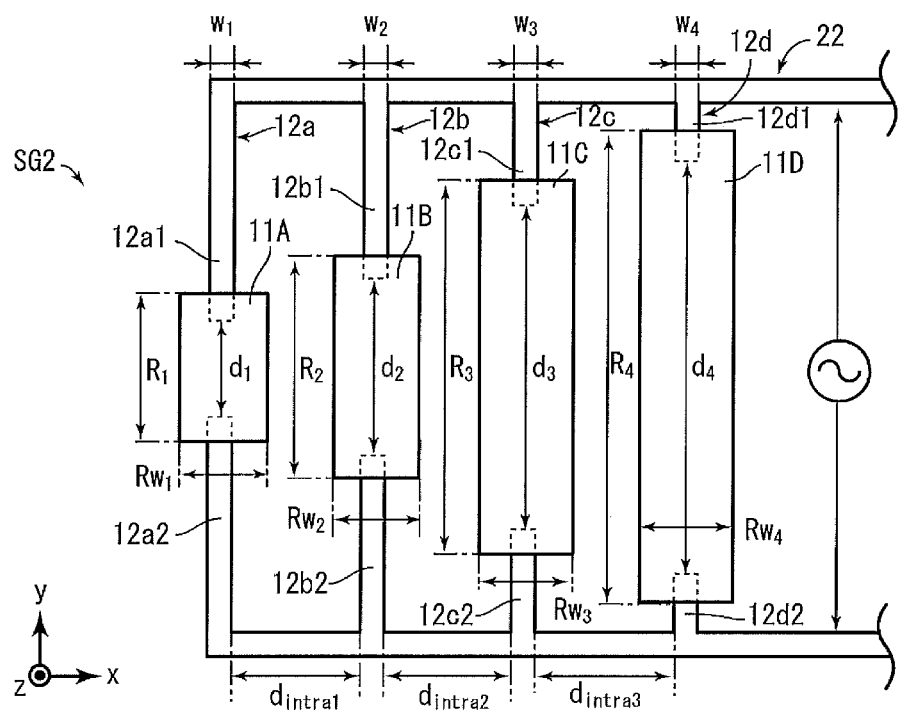
FIG. 11 is an enlarged plan view illustrating one of segments.

FIG. 11 is an enlarged plan view illustrating one of the segments SG2. The alignment electrodes 22 further include, in addition to the electrode pairs 12a to 12c, electrode pairs 12d (fourth electrode pairs) each comprised of an electrode 12d1 and an electrode 12d2. Each of the rod-shaped light-emitting elements 11D is arranged so that one end is adjacent to the electrode 12d1 and the other end is adjacent to the electrode 12d2.

The electrode 12d1 and the electrode 12d2 are arranged with a distance $d_4$ from each other. Lengths $R_3$ and $R_4$ and the distance $d_4$ satisfy the following relationships (9) and (10).

$$R_3 < d_4 \quad (9)$$

$$d_4 \leq R_4 \quad (10)$$

As in the case of the rod-shaped light-emitting elements 11A to 11C and the electrode pairs 12a to 12c, when the width of the rod-shaped light-emitting element 11D is denoted by $Rw_4$ and the width of the electrode pair 12d is denoted by $w_4$, it is preferable to satisfy $Rw_4 \geq w_4$. Further, when the distance between the electrode pair 12b and the electrode pair 12c is denoted by $d_{intra2}$, it is preferable to satisfy $(Rw_3+Rw_4)/2 < d_{intra2}$.

The lengths $R_1$ to $R_4$, the distances $d_1$ to $d_4$, the widths $Rw_1$ to $Rw_4$, the widths $w_1$ to $w_4$, and the distances $d_{intra1}$, $d_{intra2}$, and $d_{intra3}$ can be set, for example, as follows. $R_1=5$ μm, $d_1=5$ μm $R_2=10$ μm, $d_2=10$ μm $R_3=14$ μm, $d_3=14$ μm $R_4=18$ μm, $d_4=18$ μm $Rw_1=Rw_2=Rw_3=Rw_4=5$ μm $w_1=w_2=w_3=2$ μm $d_{intra1}=d_{intra2}=d_{intra3}=8$ μm A method of producing the display device 2 is substantially the same as that for the display device 1. The rod-shaped light-emitting elements that emit yellow light beams can be produced by using AlGaInP-based semiconductors.

According to the present embodiment, as in the case of the display device 1, by aligning the rod-shaped light-emitting elements 11A, 11B, 11C, and 11D in this order, it is possible to align the rod-shaped light-emitting elements 11A with the electrode pairs 11a, the rod-shaped light-emitting elements 11B with the electrode pairs 11b, the rod-shaped light-emitting elements 11C with the electrode pairs 11c, and the rod-shaped light-emitting elements 11D with the electrode pairs 11d. By regularly aligning the rod-shaped light-emitting elements 11A, 11B, 11C, and 11D, which respectively emit red, yellow, green, and blue light beams, a color image can be displayed by additive color mixture.

According to the present embodiment, it is possible to further expand the color gamut of an image to display, compared to the display device 1.

Fifth Embodiment

A display device according to a fifth embodiment of the present invention is different from the display device 2 in terms of the colors of light beams emitted by the respective rod-shaped light-emitting elements 11A to 11D. In the display device 2, the rod-shaped light-emitting elements 11A, 11B, 11C, and 11D respectively emit red, yellow, green, and blue light beams. In contrast to this, in the present embodiment, the rod-shaped light-emitting elements 11A, 11B, 11C, and 11D respectively emit green, yellow, red, and blue light beams.

A display device according to the present embodiment is further different from the display device 2 in terms of the sizes of the rod-shaped light-emitting elements and the alignment electrodes. The lengths $R_1$ to $R_4$, the distances $d_1$ to $d_4$, the widths $Rw_1$ to $Rw_4$, the widths $w_1$ to $w_4$, and the distances $d_{intra1}$, $d_{intra2}$, and $d_{intra3}$ can be set, for example, as follows.

$$R_1 = 5\ \mu m,\ d_1 = 5\ \mu m$$

$$R_2 = 8\ \mu m,\ d_2 = 8\ \mu m$$

$$R_3 = 16\ \mu m,\ d_3 = 14\ \mu m$$

$$R_4 = 20\ \mu m,\ d_4 = 18\ \mu m$$

$$Rw_1 = 6\ \mu m$$

$$Rw_2 = Rw_3 = Rw_4 = 4\ \mu m$$

$$w_1 = w_2 = w_3 = w_4 = 2\ \mu m$$

$$d_{intra1} = d_{intra2} = d_{intra3} = 6\ \mu m$$

As in the case of the second embodiment, light-emitting elements that emit green light, which has a high luminous sensitivity, is used as the rod-shaped light-emitting elements 11A, which are the shortest in length. Although yellow has a luminous sensitivity close to that of green, the light-emitting elements for these colors are not allowed to have the same length. Hence, the width $Rw_1$ of each of the rod-shaped light-emitting elements 11A, which emit green light, is set at 6 μm, and the widths of the other rod-shaped light-emitting elements are set at 4 μm, to control the entire balance.

Human luminous sensitivity becomes lower for green, yellow, red, and blue in this order. By adjusting the lengths and/or widths according to luminous sensitivity as in the present embodiment, the entire balance can be controlled.

Sixth Embodiment

A display device according to a sixth embodiment of the present embodiment is different from the display device 2 in terms of the sizes of the rod-shaped light-emitting elements and the alignment electrodes. The lengths $R_1$ to $R_4$, the distances $d_1$ to $d_4$, the widths $Rw_1$ to $Rw_4$, the widths $w_1$ to $w_4$, and the distances $d_{intra1}$, $d_{intra2}$, and $d_{intra3}$ can be set, for example, as follows.

$$R_1 = 5\ \mu m,\ d_1 = 5\ \mu m$$

$$R_2 = 8\ \mu m,\ d_2 = 8\ \mu m$$

$$R_3 = 12\ \mu m,\ d_3 = 12\ \mu m$$

$$R_4 = 16\ \mu m,\ d_4 = 15\ \mu m$$

$$Rw_1 = Rw_2 = Rw_3 = Rw_4 = 5\ \mu m$$

$$w_1 = w_2 = w_3 = 2\ \mu m$$

$$d_{intra1} = d_{intra2} = d_{intra3} = 8\ \mu m$$

In the present embodiment, the lengths $R_1$ to $R_3$ of the rod-shaped light-emitting elements 11A to 11C and the corresponding distances $d_1$ to $d_3$ of the respective electrode pairs 12a to 12c are set to be equal. Specifically, it is set that $R_1 = d_1$, $R_2 = d_2$, and $R_3 = d_3$. According to the present embodiment, the entire length can be reduced.

Other Embodiments

The embodiments of the present invention have been described above. However, the present invention is not limited only to the above-described embodiments, and various changes are possible within the scope of the invention. Further, the embodiments can be carried out in combination.

INDUSTRIAL APPLICABILITY

The present invention is industrially applicable as a display device capable of color display.

The invention claimed is:

1. A display device comprising:
a plurality of rod-shaped light-emitting elements each of which includes a semiconductor and that emit light beams having wavelength distributions different from each other; and
alignment electrodes,
the alignment electrodes including
a first electrode pair, which is comprised of a pair of electrodes arranged with a distance $d_1$ from each other,
a second electrode pair, which is comprised of a pair of electrodes arranged with a distance $d_2$ from each other, and
a third electrode pair, which is comprised of a pair of electrodes arranged with a distance $d_3$ from each other,
the plurality of rod-shaped light-emitting elements including
a first rod-shaped light-emitting element, which has an axial length $R_1$ and is arranged so that one end of the first rod-shaped light-emitting element is adjacent to one of the electrodes of the first electrode pair while another end of the first rod-shaped light-emitting element is adjacent to the other of the electrodes of the first electrode pair,
a second rod-shaped light-emitting element, which has an axial length $R_2$ and is arranged so that one end of the second rod-shaped light-emitting element is adjacent to one of the electrodes of the second electrode pair while another end of the second rod-shaped light-emitting element is adjacent to the other of the electrodes of the second electrode pair, and
a third rod-shaped light-emitting element, which has an axial length $R_3$ and is arranged so that one end of the third rod-shaped light-emitting element is adjacent to one of the electrodes of the third electrode pair while another end of the third rod-shaped light-emitting element is adjacent to the other of the electrodes of the third electrode pair, and the lengths $R_1$ to $R_3$ and the distances $d_1$ to $d_3$ satisfying the relationships (1) to (3):

$$d_1 \leq R_1 < d_2 \quad (1);$$

$$d_2 \leq R_2 < d_3 \quad (2);$$

$$d_3 \leq R_3 \quad (3).$$

2. The display device according to claim 1, wherein the plurality of rod-shaped light-emitting elements are configured to be greater in axial length and/or width in order of decreasing luminous sensitivity of light to be emitted.

3. The display device according to claim 1, wherein, when the widths of the first to third rod-shaped light-emitting elements are denoted respectively by $Rw_1$ to $Rw_3$ and the widths of the first to third electrode pairs are denoted respectively by $w_1$ to $w_3$, the widths $Rw_1$ to $Rw_3$ and the widths $w_1$ to $w_3$ satisfy the relationships (4) to (6):

$$Rw_1 \geq w_1 \quad (4);$$

$$Rw_2 \geq w_2 \quad (5);$$

$$Rw_3 \geq w_3 \quad (6).$$

4. The display device according to claim 1, wherein, when the widths of the first to third rod-shaped light-emitting elements are denoted respectively by $Rw_1$ to $Rw_3$, and a distance between the first electrode pair and the second electrode pair is denoted by $d_{intra1}$ and a distance between the second electrode pair and the third electrode pair is denoted by $d_{intra2}$, the widths $Rw_1$ to $Rw_3$ and the distances $d_{intra1}$ and $d_{intra2}$ satisfy the relationships (7) and (8):

$$(Rw_1+Rw_2)/2 < d_{intra1} \quad (7)$$

$$(Rw_2+Rw_3)/2 < d_{intra2} \quad (8)$$

5. The display device according to claim 1,
wherein the alignment electrodes further include a fourth electrode, which is comprised of a pair of electrodes arranged with a distance $d_4$ from each other,
the plurality of rod-shaped light-emitting elements further include a fourth rod-shaped light-emitting element, which has an axial length $R_4$ and which is arranged so that one end of the fourth rod-shaped light-emitting element is adjacent to one of the electrodes of the fourth electrode pair while another end of the fourth rod-shaped light-emitting element is adjacent to the other of the electrodes of the fourth electrode pair, and
the lengths $R_3$ and $R_4$ and the distance $d_4$ satisfy the relationships (9) and (10):

$$R_3 < d_4 \quad (9);$$

$$d_4 \leq R_4 \quad (10).$$

6. A method of producing a display device, the method comprising:
applying, to a substrate, a solvent in which first rod-shaped light-emitting elements each having an axial length $R_1$ are dispersed, and aligning the first rod-shaped light-emitting elements;
after aligning the first rod-shaped light-emitting elements, applying, to the substrate, a solvent in which second rod-shaped light-emitting elements each having an axial length $R_2$ are dispersed, and aligning the second rod-shaped light-emitting elements; and
after aligning the second rod-shaped light-emitting elements, applying, to the substrate, a solvent in which third rod-shaped light-emitting elements each having an axial length $R_3$ are dispersed, and aligning the third rod-shaped light-emitting elements, and
forming alignment electrodes on the substrate, the alignment electrodes including a first pair of electrodes arranged with a distance $d_1$ from each other, a second pair of electrodes arranged with a distance $d_2$ from each other, and a third pair of electrodes arranged with a distance $d_3$ from each other, wherein
the axial lengths $R_1$ to $R_3$ and the distances $d_1$ to $d_3$ satisfy the relationships (11) to (13):

$$d_1 \leq R_1 < d_2 \quad (11);$$

$$d_2 \leq R_2 < d_3 \quad (12);$$

$$d_3 \leq R_3 \quad (13).$$

7. The display device according to claim 1, wherein the first electrode pair, the second electrode pair, and the third electrode pair are electrically connected to each other such that a same signal is applied to the first electrode pair, the second electrode pair, and the third electrode pair at a same time.

8. The display device according to claim 1, further comprising:
a first interconnection that provides a driving signal to the first rod-shaped light-emitting element;
a second interconnection that provides a driving signal to the second rod-shaped light-emitting element; and
a third interconnection that provides a driving signal to the third rod-shaped light-emitting element.

9. The method of producing a display device according to claim 6, wherein while aligning the first rod-shaped light-emitting elements, the second rod-shaped light-emitting elements, and the third rod-shaped light-emitting elements, a same signal is applied to the first pair of electrodes, the second pair of electrodes, and the third pair of electrodes at a same time.

* * * * *